United States Patent
Masuda et al.

(10) Patent No.: US 8,921,903 B2
(45) Date of Patent: Dec. 30, 2014

(54) LATERAL JUNCTION FIELD-EFFECT TRANSISTOR

(75) Inventors: Takeyoshi Masuda, Osaka (JP); Yasuo Namikawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 10 days.

(21) Appl. No.: 12/517,761

(22) PCT Filed: Sep. 21, 2007

(86) PCT No.: PCT/JP2007/068345
§ 371 (c)(1),
(2), (4) Date: Jun. 4, 2009

(87) PCT Pub. No.: WO2008/075488
PCT Pub. Date: Jun. 26, 2008

(65) Prior Publication Data
US 2010/0090259 A1  Apr. 15, 2010

(30) Foreign Application Priority Data
Dec. 18, 2006  (JP) .................................. 2006-340137

(51) Int. Cl.
*H01L 29/808* (2006.01)
*H01L 29/66* (2006.01)
*H01L 21/04* (2006.01)
*H01L 29/10* (2006.01)
*H01L 29/16* (2006.01)
*H01L 29/20* (2006.01)

(52) U.S. Cl.
CPC ........ *H01L 29/808* (2013.01); *H01L 29/66901* (2013.01); *H01L 29/1608* (2013.01); *H01L 21/048* (2013.01); *H01L 29/2003* (2013.01); *H01L 29/1066* (2013.01)
USPC ..... 257/256; 257/270; 257/272; 257/E29.312

(58) Field of Classification Search
USPC ........................... 257/256, 270, 272, E29.312
See application file for complete search history.

(56) References Cited

U.S. PATENT DOCUMENTS

| | | | | |
|---|---|---|---|---|
| 4,292,642 A * | 9/1981 | Appels et al. | ................. | 257/169 |
| 4,485,392 A * | 11/1984 | Singer | ............................ | 257/272 |
| 5,012,305 A * | 4/1991 | Khadder et al. | ............... | 257/270 |
| 5,319,227 A * | 6/1994 | Lapham et al. | ................ | 257/270 |
| 6,278,143 B1 * | 8/2001 | Ejiri | ................................ | 257/273 |
| 6,303,947 B1 | 10/2001 | Ueno | | |
| 2003/0168704 A1 | 9/2003 | Harada et al. | | |
| 2006/0113574 A1 | 6/2006 | Fujikawa et al. | | |

FOREIGN PATENT DOCUMENTS

| | | |
|---|---|---|
| EP | 0 268 426 A2 | 5/1988 |
| JP | 61-101082 | 5/1986 |
| JP | 64-31471 | 2/1989 |

(Continued)

*Primary Examiner* — Lynne Gurley
*Assistant Examiner* — Vernon P Webb
(74) *Attorney, Agent, or Firm* — Venable LLP; Michael A. Sartori; Tamatane J. Aga

(57) ABSTRACT

On a $p^-$ epitaxial layer, an n-type epitaxial layer and a gate region are formed in this order. A gate electrode is electrically connected to the gate region, and a source electrode and a drain electrode are spaced apart from each other with the gate electrode sandwiched therebetween. A control electrode is used for applying to the $p^-$ epitaxial layer a voltage that causes a reverse biased state of the $p^-$ epitaxial layer and the n-type epitaxial layer in an OFF operation.

4 Claims, 7 Drawing Sheets

(56) References Cited

FOREIGN PATENT DOCUMENTS

| | | |
|---|---|---|
| JP | 1-243475 | 9/1989 |
| JP | 07-193086 A | 7/1995 |
| JP | 10-209174 | 8/1998 |
| JP | 2000-216407 A | 8/2000 |
| JP | 2002-299638 | 10/2002 |
| JP | 2003-68762 | 3/2003 |
| JP | 2003-533051 | 11/2003 |
| WO | WO-01/86727 A2 | 11/2001 |
| WO | WO 2004/112150 A1 | 12/2004 |

* cited by examiner

LATERAL JUNCTION FIELD-EFFECT TRANSISTOR

TECHNICAL FIELD

The present invention relates to a lateral junction field-effect transistor, and more particularly to a structure of a lateral junction field-effect transistor in which a leakage current in an OFF operation can be reduced.

BACKGROUND ART

A junction field-effect transistor (hereinafter referred to as JFET) has a pn junction provided on either side of a channel region where carriers flow through, and a reverse bias voltage is applied from a gate electrode to expand a depletion layer from the pn junction into the channel region, thereby controlling the conductance of the channel region to perform an operation such as switching. A lateral JFET which is one type of the JFET refers to the one in which carriers move in the channel region in parallel with the surface of the device.

The carriers in the channel may be electrons (n-type) or holes (p-type). Usually, most JFETs in which SiC is used for the semiconductor substrate include the channel region that is an n-type impurity region. Therefore, for convenience of the description below, it is supposed that carriers in the channel are electrons and thus the channel region is an n-type impurity region; however, it should be understood that the channel region is a p-type impurity region in some cases.

An example of such a lateral JFET is disclosed for example in Japanese Patent Laying-Open No. 2003-68762.

FIG. 14 is a schematic cross section showing a structure of a conventional lateral JFET disclosed in the above-referenced publication. Referring to FIG. 14, a $p^-$ epitaxial layer 103 is provided on an SiC single crystal substrate 101. On this $p^-$ epitaxial layer 103, an n-type epitaxial layer 104 having a higher impurity concentration than $p^-$ epitaxial layer 103 is provided. On this n-type epitaxial layer 104, a p-type epitaxial layer 109 is provided.

In this p-type epitaxial layer 109, an $n^+$ source region 106 and an $n^+$ drain region 107 having a higher impurity concentration than n-type epitaxial layer 104 are provided with a predetermined space therebetween. Further, between $n^+$ source region 106 and $n^+$ drain region 107, a $p^+$ gate region 105 having a higher impurity concentration than n-type epitaxial layer 104 is provided.

On respective surfaces of $p^+$ gate region 105, $n^+$ source region 106 and $n^+$ drain region 107, a gate electrode 112a, a source electrode 112b and a drain electrode 112c are provided respectively. On a lateral side of $n^+$ source region 106, a $p^+$ semiconductor layer 108 that reaches to $p^-$ epitaxial layer 103 is formed, and source electrode 112b is electrically connected to $p^+$ semiconductor layer 108.

In this lateral JFET, $p^+$ gate region 105 has its impurity concentration higher than that of n-type epitaxial layer 104. Thus, in the lateral JFET, a depletion layer is expanded toward the channel by applying a reverse bias voltage to the pn junction between $p^+$ gate region 105 and n-type epitaxial layer 104. In the state where the depletion layer closes the channel, the current cannot flow through the channel to cause an OFF state. Therefore, the magnitude of the reverse bias voltage can be adjusted to control whether to allow the depletion layer to block the channel region or not. As a result, the reverse bias voltage between the gate and the source for example can be adjusted to control the ON and OFF states of the current.

Patent Document 1: Japanese Patent Laying-Open No. 2003-68762

DISCLOSURE OF THE INVENTION

Problems to be Solved by the Invention

The above-described lateral JFET, however, has the problem that a leakage current flowing in $p^-$ epitaxial layer 103 under the channel is generated.

The present invention has been made in view of the above-described problem, and an object of the invention is to provide a lateral junction field-effect transistor in which generation of a leakage current in an OFF operation can be prevented.

Means for Solving the Problems

A lateral junction field-effect transistor of the present invention includes a withstand voltage keeping region of a first conductivity type, a channel region of a second conductivity type, a gate region of the first conductivity type, a gate electrode, a source electrode and a drain electrode, and a control electrode. The channel region is formed on the withstand voltage keeping region. The gate region is formed on the channel region. The gate electrode is electrically connected to the gate region. The source electrode and the drain electrode are spaced apart from each other with the gate electrode sandwiched between the source electrode and the drain electrode, and are electrically connected to the channel region. The control electrode is used for applying to the withstand voltage keeping region a voltage causing the withstand voltage keeping region and the channel region to be in a reverse biased state in an OFF operation.

In the lateral junction field-effect transistor of the present invention, the control electrode is used to apply a voltage that causes a reverse biased state of the withstand voltage keeping region and the channel region in an OFF state. Accordingly, in the OFF operation, the potential of the withstand voltage keeping region becomes higher than the potential of the channel region so that the potential barrier between the channel region and the withstand voltage keeping region becomes higher. Therefore, it is difficult for carriers in the channel region to climb over the potential barrier and reach the withstand voltage keeping region, and thus generation of a leakage current between the channel region and the withstand voltage keeping region can be prevented. In this way, the withstand voltage can be improved.

Preferably, regarding the above-described lateral junction field-effect transistor, a potential identical to a potential applied to the gate electrode is applied to the control electrode.

In the case where the same potential as the potential applied to the gate electrode is applied to the control electrode, the potential of the withstand voltage keeping region is also higher than the potential of the channel region. Therefore, likewise, generation of a leakage current between the channel region and the withstand voltage keeping region can be prevented and the withstand voltage can be improved.

Further, the same potential as the potential applied to the gate electrode can be applied to the withstand voltage keeping region to allow the withstand voltage keeping region to operate as a gate. Therefore, the mutual conductance represented by a variation of the drain current with respect to a variation of the gate voltage can be increased.

Preferably, regarding the above-described lateral junction field-effect transistor, the control electrode is electrically insulated from the source electrode.

The control electrode is electrically insulated from the source electrode as described above so that a voltage can be applied using the control electrode to cause a reverse biased state of the withstand voltage keeping region and the channel region in an OFF state.

Preferably, the above-described lateral junction field-effect transistor further includes an electric field alleviation region of the first conductivity type formed on the channel region and at a lateral side of the gate region and having an impurity concentration lower than an impurity concentration of the gate electrode.

Accordingly, the channel region of the second conductivity type is sandwiched between the withstand voltage keeping region of the first conductivity type and the electric field alleviation region of the first conductivity type, and thus a double RESURF (Reduced Surface Field) structure can be implemented. Therefore, dielectric breakdown due to electric field concentration can be prevented and the withstand voltage characteristic of the device can be improved.

Preferably, the above-described lateral junction field-effect transistor further includes a source region of the second conductivity type formed on the channel region, electrically connected to the source electrode and having an impurity concentration higher than an impurity concentration of the channel region, and a drain region of the second conductivity type formed on the channel region, electrically connected to the drain electrode and having an impurity concentration higher than the impurity concentration of the channel region.

Since the source region and the drain region higher in impurity concentration than the channel region are provided, the connection resistance when the source electrode and the drain electrode are electrically connected to the channel region can be reduced.

Effects of the Invention

As seen from the description above, in the lateral junction field-effect transistor of the present invention, generation of a leakage current can be prevented and the withstand voltage can be improved.

DESCRIPTION OF THE REFERENCE SIGNS 1 substrate, 2 p-type epitaxial layer, 3 p⁻ epitaxial layer, 4 n-type epitaxial layer, 5 p⁺ gate region, 6 n⁺ source region, 7 n⁺ drain region, 8 p⁺ impurity region, 9 p-type epitaxial layer, 11a, 11b, 11c, 11d ohmic electrode, 12a gate electrode, 12b source electrode, 12c drain electrode, 12d control electrode, 13 field oxide film, 20 passivation film, 31 32 ion block film

BEST MODES FOR CARRYING OUT THE INVENTION

In the following, embodiments of the present invention will be described with reference to the drawings.

First Embodiment

Figure 1:
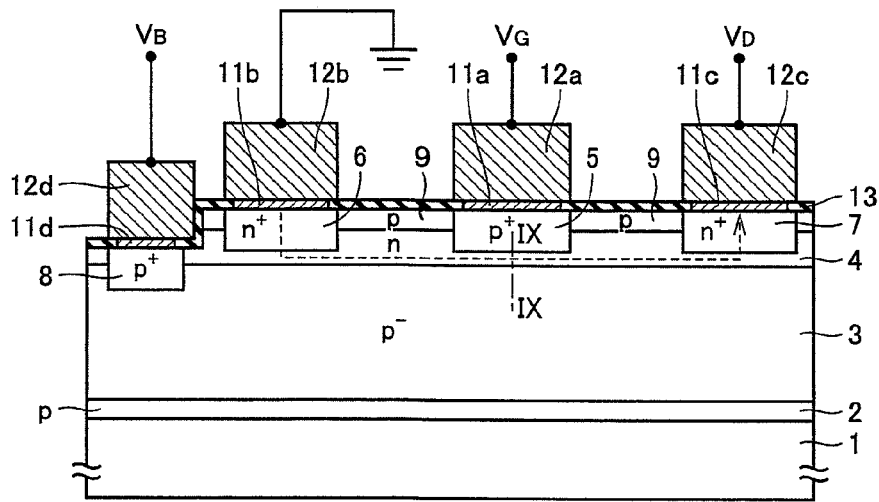
FIG. 1 is a cross section schematically showing a structure of a lateral junction field-effect transistor in a first embodiment of the present invention.

FIG. 1 is a cross section schematically showing a structure of a lateral junction field-effect transistor in a first embodiment of the present invention. Referring to FIG. 1, a single crystal substrate 1 that is of any conductivity type and made for example of 4H—SiC (silicon carbide) is used as a semiconductor substrate. On substrate 1, a p-type epitaxial layer 2 and a p⁻ epitaxial layer (withstand voltage keeping region) 3 are formed in layers stacked in this order. P-type epitaxial layer 2 includes Al (aluminum) as a p-type impurity with a concentration for example of $5.0 \times 10^{16}$ cm⁻³ and has a thickness for example of 0.5 μm. P⁻ epitaxial layer 3 includes Al as a p-type impurity with a concentration for example of $1.0 \times 10^{16}$ cm⁻³ and has a thickness for example of 10 μm.

On p⁻ epitaxial layer 3, an n-type epitaxial layer (channel region) 4 is formed. N-type epitaxial layer 4 includes N (nitrogen) as an n-type impurity with a concentration for example of $2.0 \times 10^{17}$ cm⁻³ and has a thickness for example of 0.4 μm.

On n-type epitaxial layer 4, a p-type epitaxial layer (electric field alleviation region) 9 is formed. P-type epitaxial layer 9 includes Al as a p-type impurity with a concentration for example of $2.0 \times 10^{17}$ cm⁻³ and has a thickness for example of 0.2 μm.

On n-type epitaxial layer 4 and in p-type epitaxial layer 9, a p⁺ gate region 5 is formed with its bottom surface extending into n-type epitaxial layer 4 (namely the depth of diffusion is deeper than p-type epitaxial layer 9). P⁺ gate region 5 has an impurity concentration higher than p-type epitaxial layer 9 and n-type epitaxial layer 4. An n$^+$ source region 6 and an n$^+$ drain region 7 are formed with a predetermined distance therebetween so that p$^+$ gate region 5 is sandwiched between the source region and the drain region. N$^+$ source region 6 and n$^+$ drain region 7 are each formed on n-type epitaxial layer 4 and in p-type epitaxial layer 9 and have a higher impurity concentration than n-type epitaxial layer 4.

At a lateral side of n$^+$ source region 6, a trench (a depressed portion) that reaches to n-type epitaxial layer 4 is formed. A p$^+$ impurity region 8 is formed to reach from the bottom surface of the trench to p$^-$ epitaxial layer 3. P$^+$ impurity region 8 has an impurity region higher than p$^-$ epitaxial layer 3.

A field oxide film 13 is formed to cover a surface where a transistor is to be formed. In field oxide film 13, openings are provided to open a part of p$^+$ gate region 5, n$^+$ source region 6, n$^+$ drain region 7 and p$^+$ impurity region 8 each. In respective openings, ohmic electrodes 11a, 11b, 11c, 11d made for example of Ni (nickel) are formed in order to make an ohmic contact. A gate electrode 12a, a source electrode 12b, a drain electrode 12c, and a control electrode 12d are formed so that these electrodes are electrically connected to p$^+$ gate electrode 5, n$^+$ source electrode 6, n$^+$ drain electrode 7 and p$^+$ impurity region 8 respectively via these ohmic electrodes 11a, 11b, 11c, and 11d.

These gate electrode 12a, source electrode 12b, drain electrode 12c, and control electrode 12d are each made for example of Al (aluminum). Source electrode 12b and drain electrode 12c are spaced apart from each other with gate electrode 12a sandwiched therebetween.

Gate electrode 12a is structured so that a gate voltage $V_G$ can be applied thereto, source electrode 12b is structured to be at a ground potential, and drain electrode 12c is structured so that a drain voltage $V_D$ can be applied thereto. Control electrode 12d is structured to be electrically insulated from source electrode 12b and is structured so that a voltage $V_B$ can be applied thereto. Namely, control electrode 12d is structured so that voltage $V_B$ can be applied to p$^-$ epitaxial layer 3 to cause a reverse biased state of p$^-$ epitaxial layer 3 and n-type epitaxial layer 4 in an OFF operation.

Next, a method of manufacturing the lateral junction field-effect transistor in the present embodiment will be described.

Figure 2:
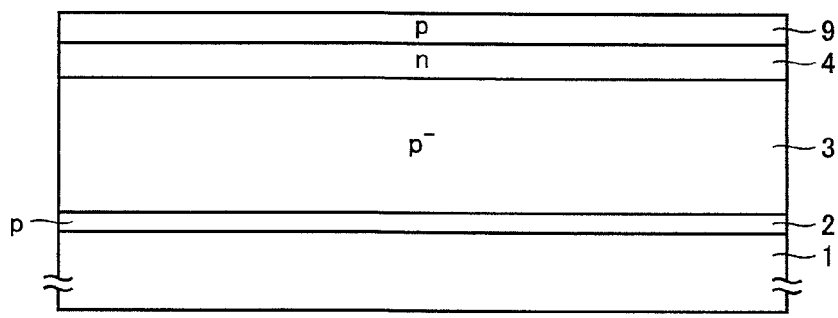
FIG. 2 is a schematic cross section showing a first step of a method of manufacturing the lateral junction field-effect transistor in the first embodiment of the present invention.

FIGS. 2 to 8 are schematic cross sections showing the method of manufacturing the lateral junction field-effect transistor in the first embodiment of the present invention, the method being shown in the order of steps. Referring to FIG. 2, on single crystal substrate 1 made for example of 4H—SiC, p-type epitaxial layer 2, p$^-$ epitaxial layer (withstand voltage keeping region) 3, n-type epitaxial layer (channel region) 4, and p-type epitaxial layer (electric field alleviation region) 9 are formed in layers stacked in this order through epitaxial growth.

Figure 3:
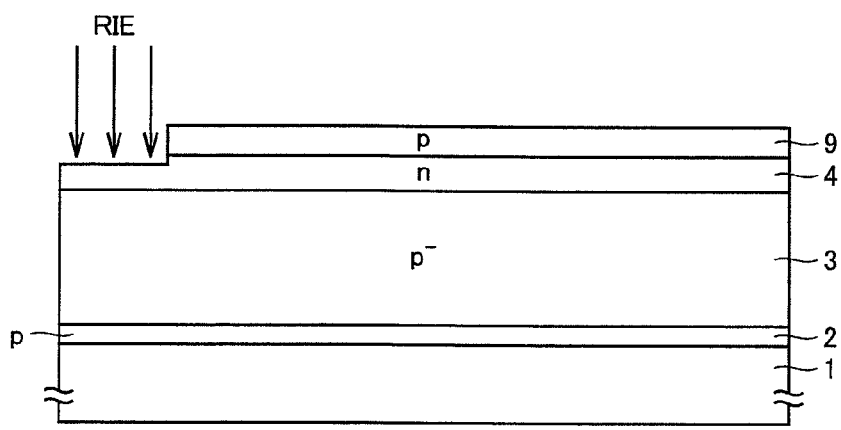
FIG. 3 is a schematic cross section showing a second step of the method of manufacturing the lateral junction field-effect transistor in the first embodiment of the present invention.

Referring to FIG. 3, since it is necessary to form a plurality of transistors on a single substrate, a trench (depressed portion) for physically isolating transistors from each other is formed. The trench is formed by performing RIE (Reactive Ion Etching) using, as a mask, an anti-etching film (not shown) formed on p-type epitaxial layer 9. In this way, a trench extending through p-type epitaxial layer 9 to reach to n-type epitaxial layer 4 is selectively formed.

Figure 4:
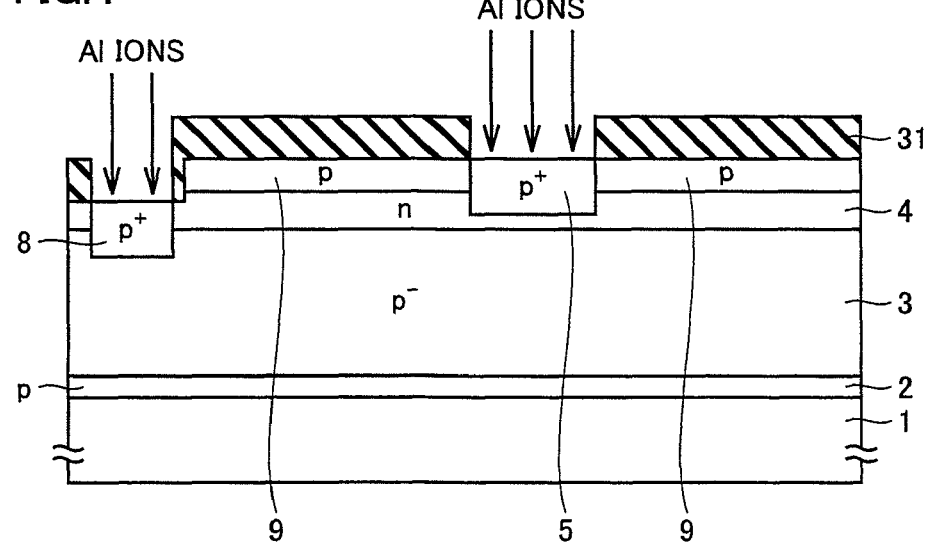
FIG. 4 is a schematic cross section showing a third step of the method of manufacturing the lateral junction field-effect transistor in the first embodiment of the present invention.

Referring to FIG. 4, a patterned ion block film 31 is formed on the surface of the substrate. Ion block film 31 is used as a mask to selectively implant Al ions for example to the bottom surface of the trench and a predetermined region of p-type epitaxial layer 9. Accordingly, ion-implanted regions 5, 8 are formed. Ion block film 31 is thereafter removed.

Figure 5:
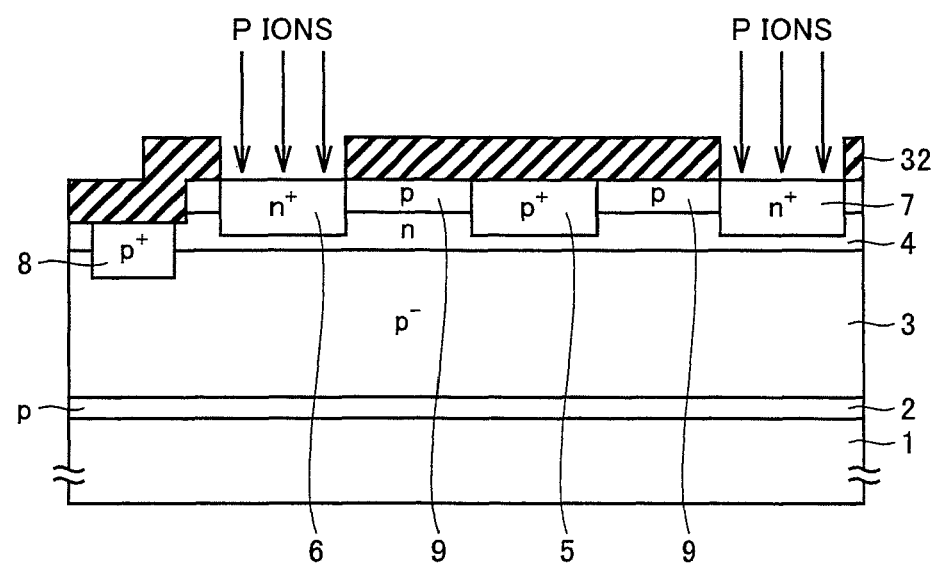
FIG. 5 is a schematic cross section showing a fourth step of the method of manufacturing the lateral junction field-effect transistor in the first embodiment of the present invention.

Referring to FIG. 5, a patterned ion block film 32 is formed on the surface of the substrate. Ion block film 32 is used as a mask to selectively implant P (phosphorus) ions for example to predetermined regions of p-type epitaxial layer 9 between which ion-implanted region 5 is sandwiched. Accordingly, ion-implanted regions 6, 7 are formed. Ion block film 32 is thereafter removed.

Figure 6:
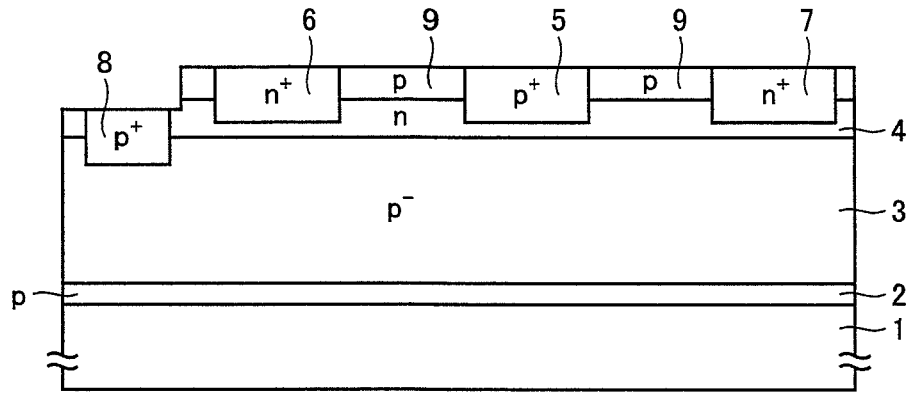
FIG. 6 is a schematic cross section showing a fifth step of the method of manufacturing the lateral junction field-effect transistor in the first embodiment of the present invention.

Referring to FIG. 6, in order to activate the impurities supplied by the ion implantation and to recover from any crystal damage caused by the ion implantation, heat treatment (anneal) is performed in an Ar (argon) atmosphere for example. Accordingly, p$^+$ gate region 5 and p$^+$ impurity region 8 are formed from ion-implanted regions 5 and 8 respectively, and n$^+$ source region 6 and n$^+$ drain region 7 are formed from ion-implanted regions 6 and 7 respectively.

Figure 7:
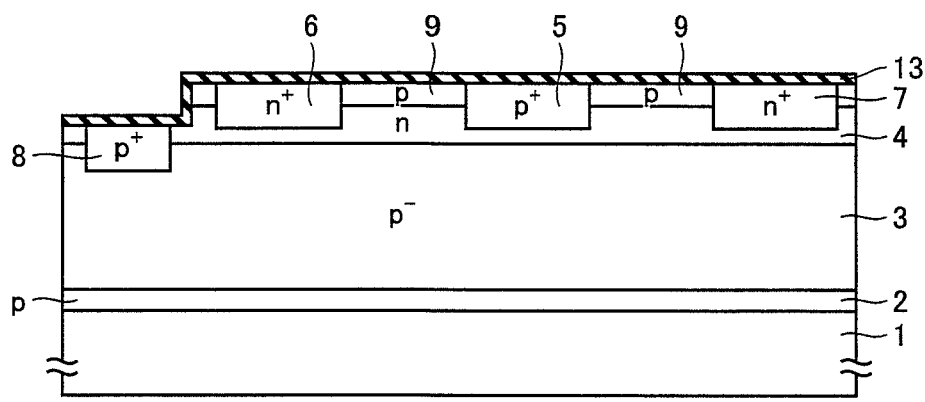
FIG. 7 is a schematic cross section showing a sixth step of the method of manufacturing the lateral junction field-effect transistor in the first embodiment of the present invention.

Referring to FIG. 7, a thermal oxidation method is used to form field oxide film 13 on the substrate surface for protecting and electrically insulating the substrate surface.

Figure 8:
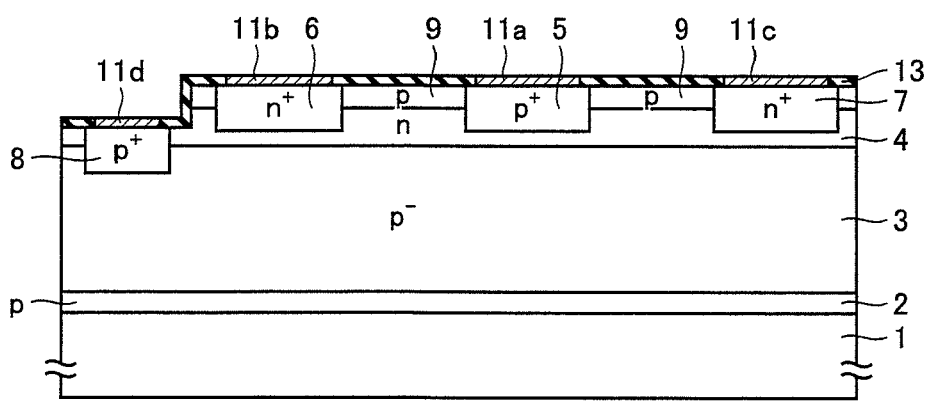
FIG. 8 is a schematic cross section showing a seventh step of the method of manufacturing the lateral junction field-effect transistor in the first embodiment of the present invention.

Referring to FIG. 8, predetermined regions of field oxide film 13 are opened to expose a part of p$^+$ gate region 5, n$^+$ source region 6, n$^+$ drain region 7, and p$^+$ impurity region 8 each. After this, Ni is vapor-deposited to form ohmic electrodes 11a, 11b, 11c, 11d made of Ni on respective surfaces of the exposed regions.

Referring to FIG. 1, Al is vapor-deposited on the whole surface of the substrate, and thereafter the Al is patterned by etching, so that gate electrode 12a, source electrode 12b, drain electrode 12c, and control electrode 12d made for example of Al are formed. Electrodes 12a to 12d each can also function as an interconnection or pad.

In this way, the lateral junction field-effect transistor in the present embodiment as shown in FIG. 1 can be manufactured.

In the lateral junction field-effect transistor in the present embodiment, a leakage current in an OFF operation can be reduced as compared with the conventional example, as described in the following.

Figure 9:
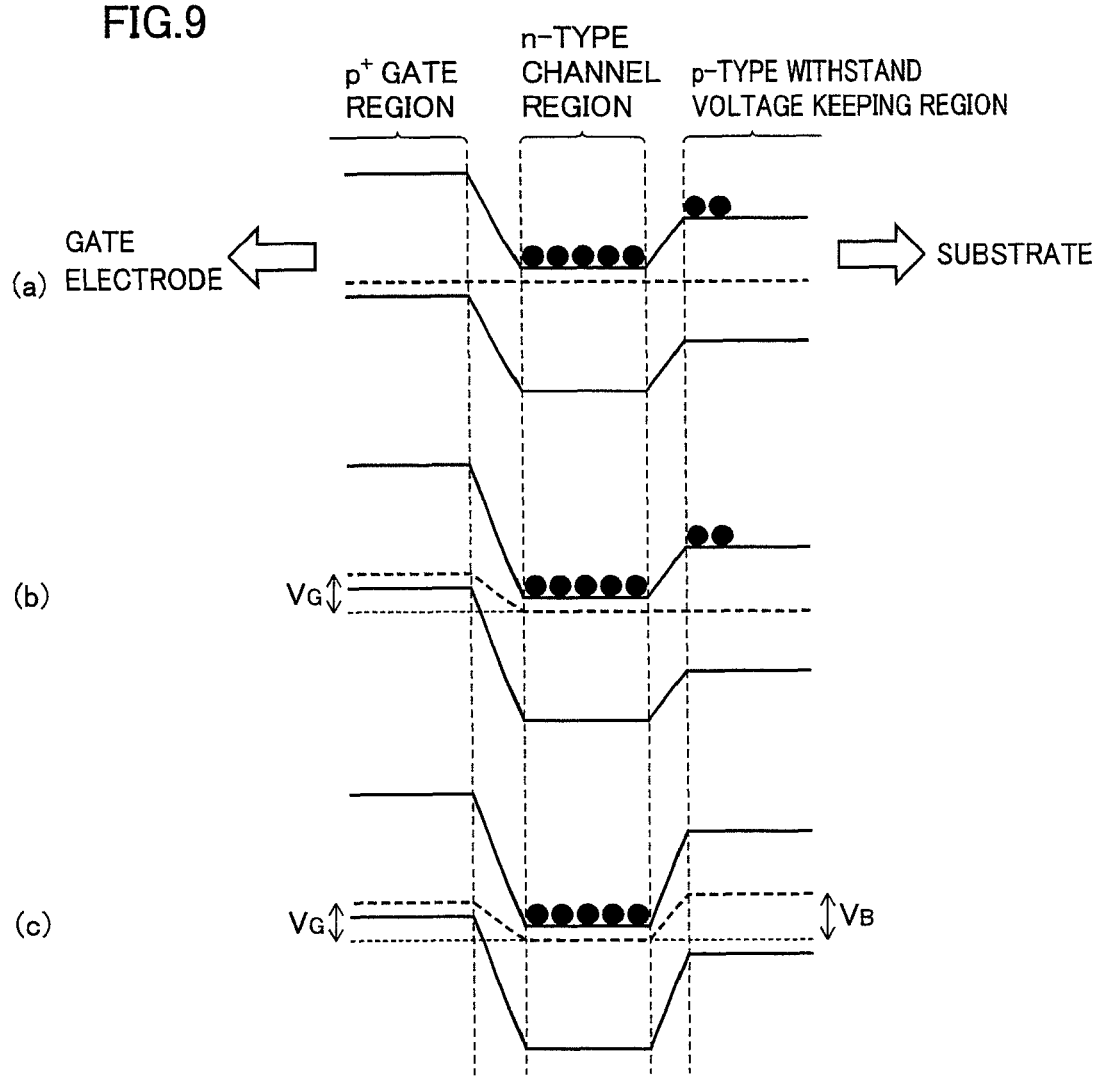
FIG. 9 is a diagram showing an energy band of a portion along a line IX-IX in FIG. 1.

FIG. 9 is a diagram showing an energy band of a portion along a line IX-IX in FIG. 1. In the case where no voltage is applied to each of the gate region and the withstand voltage keeping region, the energy band is in the state as indicated by FIG. 9(a) in both of the conventional example and the present embodiment. In this diagram of the band, electrons are represented by solid black circular marks.

In this state, gate voltage $V_G$ is applied to the gate region. Accordingly, as indicated by FIG. 9(b), the potential barrier between p$^+$ gate region 5 and n-type epitaxial layer (channel region) 4 becomes higher. In the conventional example, p$^-$ epitaxial layer (withstand voltage keeping region) 103 and n-type epitaxial layer (channel region) 104 are set at a source potential (ground potential) and thus respective potentials are identical to each other. Therefore, when a high electric field is applied, the potential of p$^-$ epitaxial layer (withstand voltage keeping region) 103 relative to the source side (namely n-type channel region 104 side) significantly decreases, so that a leakage current undesirably flows.

In contrast, in the present embodiment, p$^-$ epitaxial layer (withstand voltage keeping region) 3 is electrically insulated from n-type epitaxial layer (channel region) 4, and voltage $V_B$ can be applied that causes a reverse biased state of p$^-$ epitaxial layer (withstand voltage keeping region) 3 and n-type epitaxial layer (channel region) 4. When this voltage $V_B$ is applied, as indicated by FIG. 9(c), the potential barrier between n-type epitaxial layer (channel region) 4 and p$^-$ epitaxial layer (withstand voltage keeping region) 3 becomes higher. Therefore, it is difficult for carriers (electrons) in n-type epitaxial layer (channel region) 4 to climb over the potential barrier and reach p$^-$ epitaxial layer (withstand voltage keeping region) 3. For this reason, occurrence of the leakage current between n-type epitaxial layer (channel region) 4 and p⁻ epitaxial layer (withstand voltage keeping region) 3 can be prevented as compared with the conventional example, and the withstand voltage can be improved.

Second Embodiment

Figure 10:
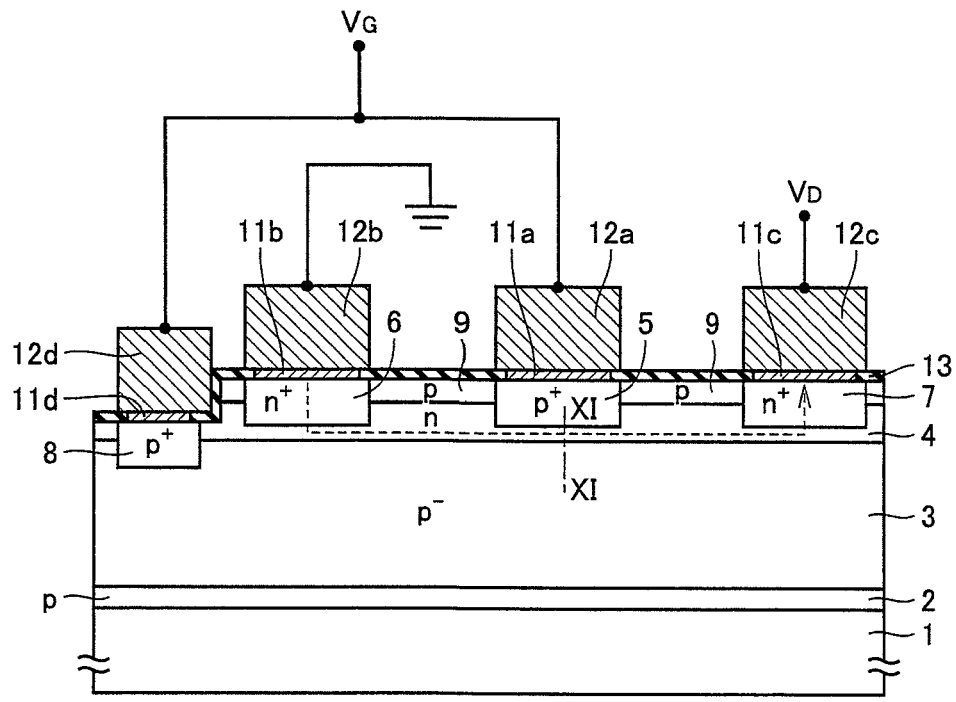
FIG. 10 is a cross section schematically showing a structure of a lateral junction field-effect transistor in a second embodiment of the present invention.

FIG. 10 is a cross section schematically showing a structure of a lateral junction field-effect transistor in a second embodiment of the present invention. Referring to FIG. 10, the lateral junction field-effect transistor in the present embodiment differs from the structure of the first embodiment shown in FIG. 1 in that the former is configured to allow a gate potential $V_G$ to be applied to control electrode 12d. Therefore, control electrode 12d may be electrically connected to gate electrode 12a.

Components of the lateral junction field-effect transistor in the present embodiment other than the above-described one are substantially identical to those of the above-described structure of the first embodiment. Therefore, like components are denoted by like reference characters and the description thereof will not be repeated. Further, a manufacturing method in the present embodiment is also substantially identical to the manufacturing method in the first embodiment. Therefore, the description thereof will not be repeated.

In the present embodiment, like the first embodiment, the leakage current can be reduced in an OFF operation as compared with the conventional example, as described in the following.

Figure 11:
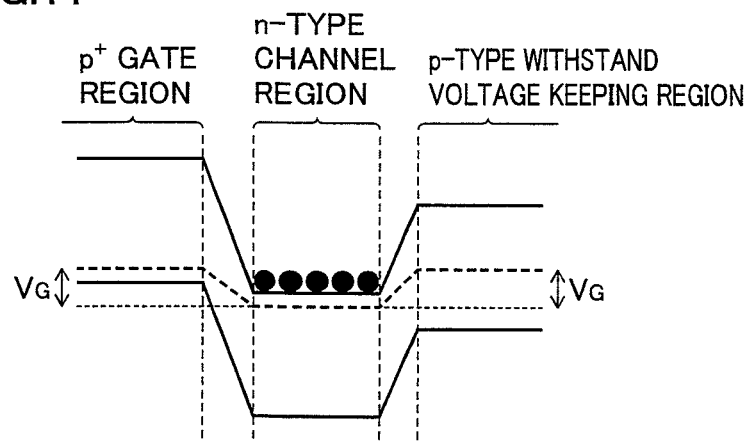
FIG. 11 shows an energy band of a portion along a line XI-XI in FIG. 10 in an OFF operation.

FIG. 11 is a diagram showing an energy band along a line XI-XI in FIG. 10 in an OFF operation. Referring to FIG. 11, gate voltage $V_G$ is applied to control electrode 12d. The application of gate voltage $V_G$ causes p⁻ epitaxial layer 3 and n-type epitaxial layer 4 to become a reverse biased state. Therefore, the potential barrier between n-type epitaxial layer (channel region) 4 and p⁻ epitaxial layer (withstand voltage keeping region) 3 becomes higher. Accordingly, it is difficult for carriers (electrons) in n-type epitaxial layer (channel region) 4 to climb over the potential barrier and reach p⁻ epitaxial layer (withstand voltage keeping region) 3. Thus, even if a high electric field is applied, occurrence of the leakage current between n-type epitaxial layer (channel region) 4 and p⁻ epitaxial layer (withstand voltage keeping region) 3 can be prevented as compared with the conventional example, and the withstand voltage can be improved.

Further, the same potential as gate voltage $V_G$ may be applied to p⁻ epitaxial layer (withstand voltage keeping region) 3 so that p⁻ epitaxial layer (withstand voltage keeping region) 3 functions as a gate. Thus, the mutual conductance represented by a variation of the drain current relative to a variation of the gate voltage can be increased.

In the above-described first and second embodiments, n-type epitaxial layer 4 is sandwiched between p⁻ epitaxial layer 3 and n-type epitaxial layer 9. Thus, a double RESURF structure can be implemented. Accordingly, electric field concentration around gate electrode 12a is alleviated. Thus, dielectric breakdown due to the field concentration can be prevented and the withstand voltage characteristic of the device is improved.

Figure 12:
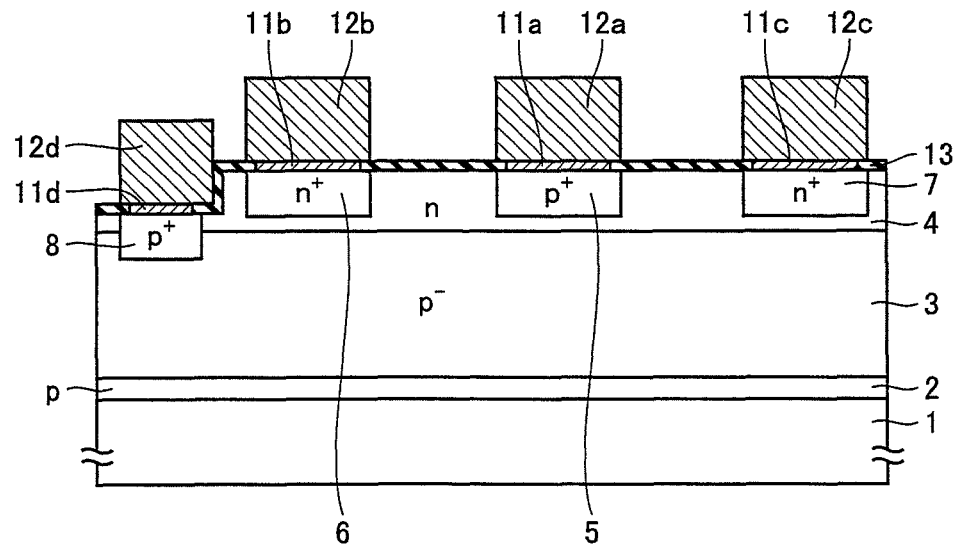
FIG. 12 is a schematic cross section showing a structure in the case where a p-type epitaxial layer (electric field alleviation region) is not provided.

The present invention, however, is not limited to the double RESURF structure, and may be the one without p-type epitaxial layer (electric field alleviation region) 9 as shown in FIG. 12.

Further, the embodiments are described above regarding the substrate made of 4H—SiC. The present invention, however, is not limited to this and the material for the substrate may be Si (silicon), 6H—SiC, 3C—SiC, GaN (potassium nitride) or the like.

Figure 13:
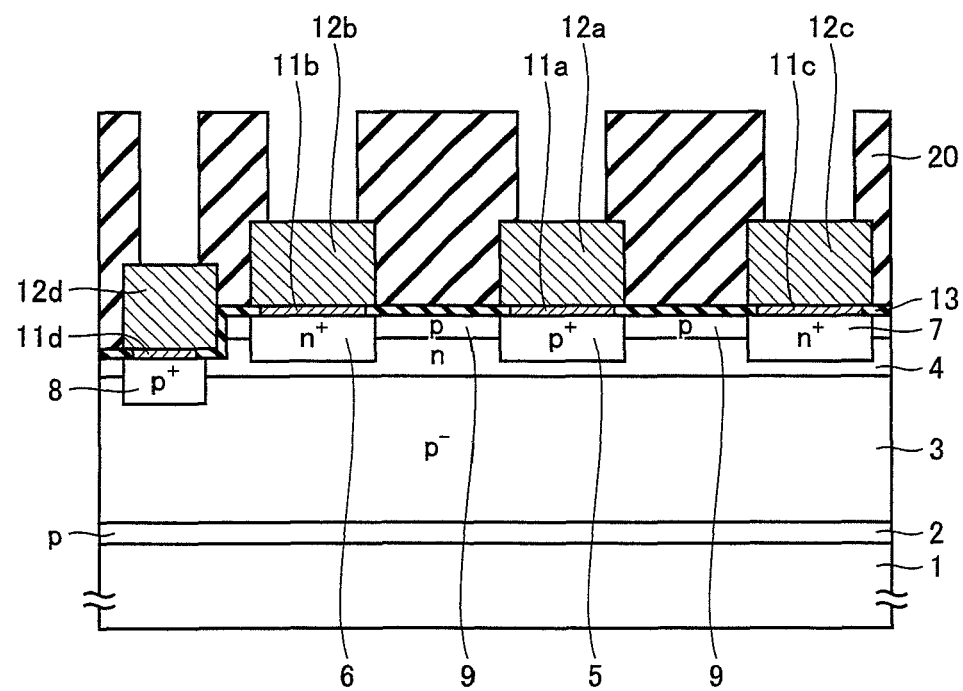
FIG. 13 is a schematic cross section showing a structure in the case where a passivation film is formed.
Figure 14:
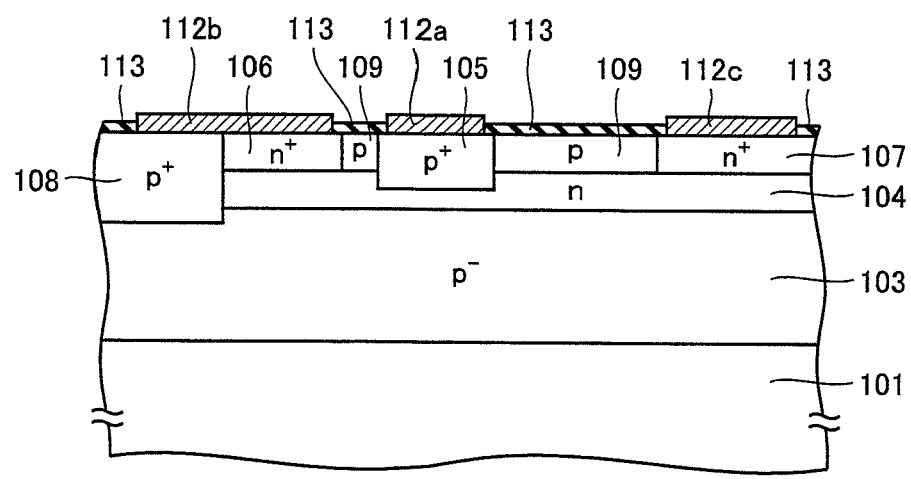
FIG. 14 is a schematic cross section showing a structure of a conventional lateral JFET disclosed in Japanese Patent Laying-Open No. 2003-68762.

Further, in the case where passivation film 20 is formed as shown in FIG. 13, passivation film 20 covers the substrate surface and includes openings for exposing gate electrode 12a, source electrode 12b, drain electrode 12c and control electrode 12d, respectively.

It should be construed that embodiments disclosed above are by way of illustration in all respects, not by way of limitation. It is intended that the scope of the present invention is defined by claims, not by the embodiments and examples above, and includes all modifications and variations equivalent in meaning and scope to the claims.

INDUSTRIAL APPLICABILITY

The present invention is advantageously applicable to a lateral junction field-effect transistor in which a leakage current in an OFF operation can be reduced.

The invention claimed is:

1. A lateral junction field-effect transistor comprising:
   a withstand voltage keeping region of a first conductivity type;
   a channel region of a second conductivity type formed on said withstand voltage keeping region;
   a gate region of the first conductivity type formed on said channel region;
   a gate electrode electrically connected to said gate region and for receiving a first voltage;
   a source electrode and a drain electrode spaced apart from each other with said gate electrode sandwiched between the source electrode and the drain electrode, and electrically connected to said channel region;
   a control electrode electrically connected to an impurity region of the first conductivity type, the impurity region electrically connected to the withstand voltage keeping region of the first conductivity type, the control electrode for receiving a second voltage and applying the second voltage to said withstand voltage keeping region causing said withstand voltage keeping region and said channel region to be in a reverse biased state in an OFF operation, the first voltage being different from the second voltage wherein the source electrode is located between the control electrode and the gate electrode, and
   a depressed portion having a bottom located in the channel region without extending into the withstand voltage keeping region is formed laterally next to the source electrode,
   wherein the impurity region electrically connected to the control electrode extends from the bottom of the depressed portion into the withstand voltage keeping region.

2. The lateral junction field-effect transistor according to claim 1, wherein
   said control electrode is electrically insulated from said source electrode.

3. The lateral junction field-effect transistor according to claim 1, further comprising an electric field alleviation region of the first conductivity type formed on said channel region and at a lateral side of said gate region and having an impurity concentration lower than an impurity concentration of said gate region.

4. The lateral junction field-effect transistor according to claim 1, further comprising:
   a source region of the second conductivity type formed on said channel region, electrically connected to said source electrode and having an impurity concentration higher than an impurity concentration of said channel region; and a drain region of the second conductivity type formed on said channel region, electrically connected to said drain electrode and having an impurity concentration higher than the impurity concentration of said channel region.

* * * * *